(12) United States Patent
Yang et al.

(10) Patent No.: US 9,818,644 B2
(45) Date of Patent: Nov. 14, 2017

(54) INTERCONNECT STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shin-Yi Yang, New Taipei (TW); Hsi-Wen Tien, Hsinchu (TW); Ming-Han Lee, Taipei (TW); Hsiang-Huan Lee, Hsinchu County (TW); Shau-Lin Shue, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/088,134

(22) Filed: Apr. 1, 2016

(65) Prior Publication Data

US 2016/0218035 A1    Jul. 28, 2016

Related U.S. Application Data

(62) Division of application No. 14/222,181, filed on Mar. 21, 2014, now Pat. No. 9,318,439.

(51) Int. Cl.
*H01L 23/48* (2006.01)
*H01L 21/768* (2006.01)
(Continued)

(52) U.S. Cl.
CPC .. *H01L 21/76879* (2013.01); *H01L 21/28562* (2013.01); *H01L 21/76816* (2013.01);
(Continued)

(58) Field of Classification Search
CPC ......... H01L 21/76876; H01L 21/76844; H01L 21/76883; H01L 21/28556; H01L 23/5226;
(Continued)

(56) References Cited

U.S. PATENT DOCUMENTS

2006/0071334 A1* 4/2006 Kawabata ............. B82Y 10/00
                                                                257/741
2007/0228361 A1   10/2007 Raravikar et al.
(Continued)

FOREIGN PATENT DOCUMENTS

TW   200744946   12/2007
TW   201034153    9/2010

OTHER PUBLICATIONS

Office action issued by Taiwan Intellectual Property Office dated Jun. 14, 2016 for corresponding Taiwan application 103145993. US2007/0228361 is the US counterpart of TW200744946, serves as the translation of TW200744946.
(Continued)

*Primary Examiner* — Dale E Page
*Assistant Examiner* — Wasiul Haider
(74) *Attorney, Agent, or Firm* — WPAT, P.C., Intellectual Property Attorneys; Anthony King

(57) ABSTRACT

The present disclosure provides an interconnect structure, including a substrate, a first conductive feature over the substrate, a second conductive feature over the first conductive feature, and a dielectric layer surrounding the first conductive feature and the second conductive feature. A width of the first conductive feature and a width of the second conductive feature are between 10 nm and 50 nm. The present disclosure also provides a method for manufacturing an interconnect structure, including (1) forming a via opening and a line trench in a dielectric layer, (2) forming a 1-dimensional conductive feature in the via opening, (3) forming a conformal catalyst layer over a sidewall of the line trench, a bottom of the line trench, and a top of the 1-dimensional conductive feature, and (4) removing the conformal catalyst layer from the bottom of the line trench and the top of the 1-dimensional conductive feature.

20 Claims, 14 Drawing Sheets

(51) Int. Cl.
*H01L 23/532* (2006.01)
*H01L 23/485* (2006.01)
*H01L 23/522* (2006.01)
*H01L 21/285* (2006.01)

(52) U.S. Cl.
CPC .. *H01L 21/76844* (2013.01); *H01L 21/76876* (2013.01); *H01L 21/76883* (2013.01); *H01L 23/481* (2013.01); *H01L 23/485* (2013.01); *H01L 23/5226* (2013.01); *H01L 23/53276* (2013.01); *H01L 23/53295* (2013.01); *H01L 21/28556* (2013.01); *H01L 2221/1094* (2013.01); *H01L 2924/0002* (2013.01)

(58) Field of Classification Search
CPC ............. H01L 23/53295; H01L 23/485; H01L 23/481; H01L 23/53276; H01L 2221/1094; H01L 2924/0002
See application file for complete search history.

(56) References Cited

U.S. PATENT DOCUMENTS

| | | | |
|---|---|---|---|
| 2012/0052680 A1* | 3/2012 | Sakuma | H01L 21/76876 438/675 |
| 2012/0086132 A1* | 4/2012 | Kim | B82Y 30/00 257/774 |
| 2013/0015581 A1* | 1/2013 | Wann | H01L 23/53276 257/751 |
| 2013/0075929 A1 | 3/2013 | Katagiri et al. | |
| 2015/0069625 A1* | 3/2015 | Li | H01L 21/76846 257/774 |
| 2015/0137377 A1* | 5/2015 | Bao | H01L 23/5226 257/758 |

OTHER PUBLICATIONS

Office action and search report dated Mar. 30, 2017 from the Chinese Intellectual Property Office for Chinese application 201510122317.7.

\* cited by examiner

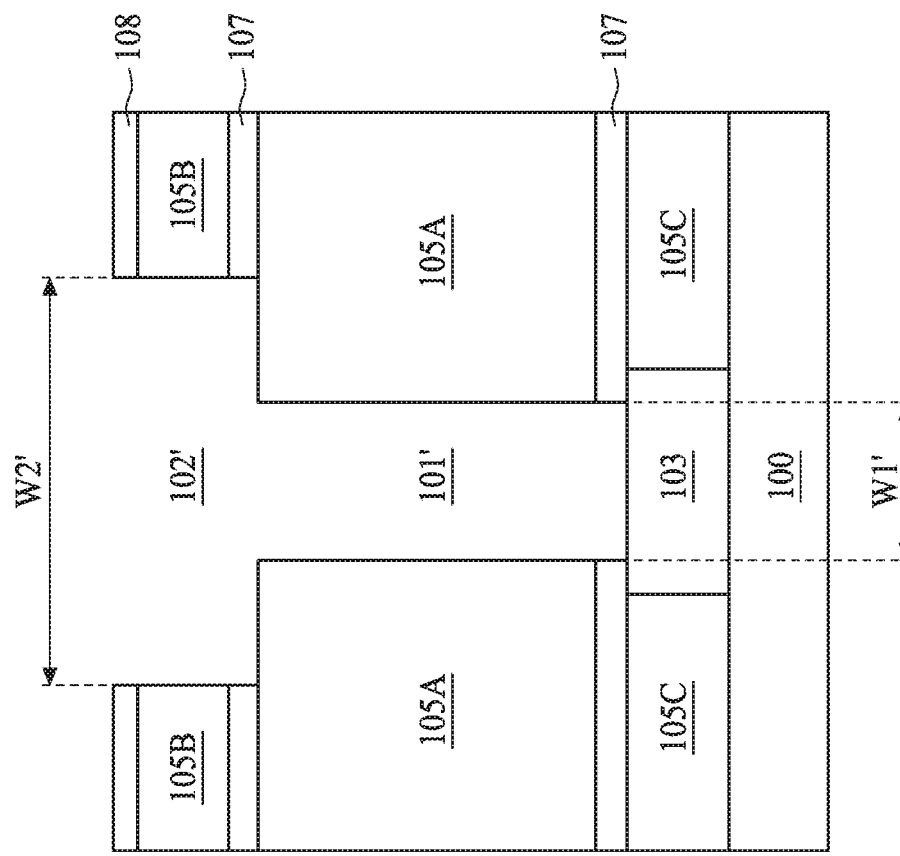

INTERCONNECT STRUCTURE AND MANUFACTURING METHOD THEREOF

PRIORITY CLAIM AND CROSS REFERENCE

This application claims its priority to U.S. non-provisional application Ser. No. 14/222,181, filed Mar. 21, 2014.

BACKGROUND

In semiconductor technology, an integrated circuit pattern can be formed on a substrate using various processes including a photolithography process, ion implantation, deposition and etch. Damascene processes are utilized to form multilayer copper interconnections including vertical interconnection vias and horizontal interconnection metal lines. During a damascene process, trenches are formed in a dielectric material layer, copper or tungsten is filled in the trenches, then a chemical mechanical polishing (CMP) process is applied to remove excessive metal on the dielectric material layer and planarize the top surface.

The use of copper as a conductive interconnect material is favored in semiconductor devices because of the low resistivity and high thermal conductivity that copper provides. Copper interconnect structures are typically formed using damascene processing technology. As the critical dimensions of integrated circuits (ICs) continue to shrink, the performance of the copper-based interconnect structure faces challenges in manufacturing, device performance, and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
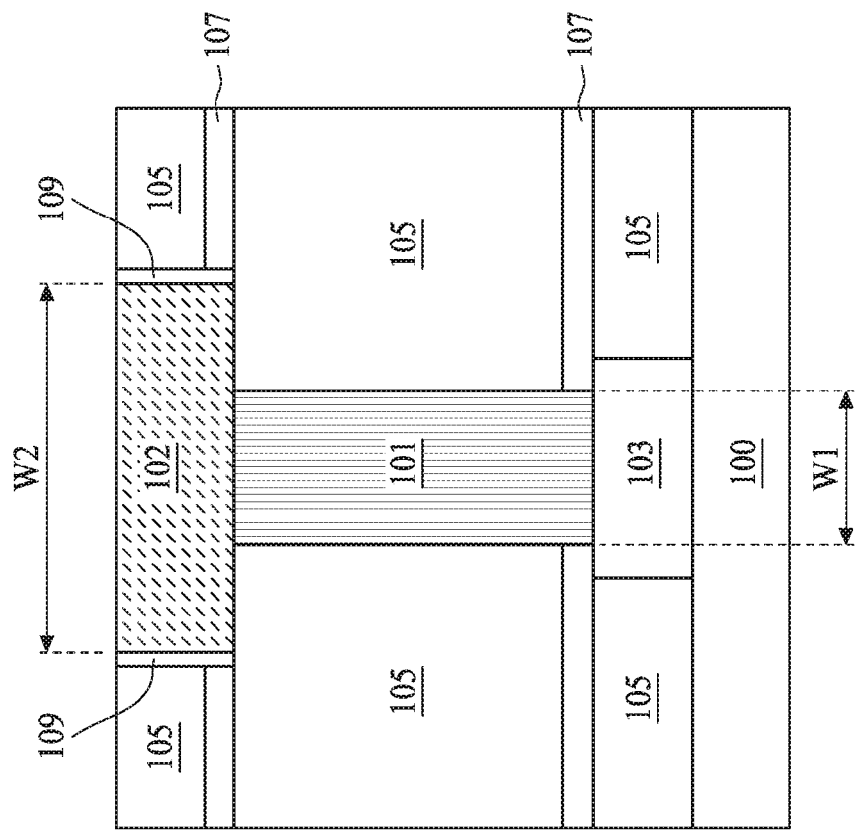
FIG. 1 is a cross sectional view of an interconnect structure, in accordance with some embodiments of the present disclosure.
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the integrated circuit (IC) fabrication moves to advanced technology nodes, the IC feature size scales down to smaller dimensions. For example, the line trench or the via dimensions get smaller and smaller. Accordingly, the gap-filling ability for copper interconnect structure is limited and the gap-filling quality is challenged. For instance, when a line width of an interconnect structure advances to below 50 urn, the barrier and seed layer material accumulation at the vicinity of the trench or via openings block the channel for subsequent copper filling. The blocked openings lead to possible void formation after the electrochemical plating of copper materials.

Apart from the gap-filling ability, electro migration (EM) is another phenomenon prone to occur in smaller dimension copper-based interconnect structure. EM is the transport of material caused by the gradual movement of the ions in a conductor due to the momentum transfer between conducting electrons and diffusing metal atoms. EM decreases the reliability of integrated circuits, and eventually may cause degradation or failure of a semiconductor device. For example, seams and voids caused by EM in the copper interconnect body increase the resistivity of the interconnect structure. The reliability of the copper interconnect structure is deteriorated due to a limited current density of about $10^6$ $A/cm^2$ to possibly prevent the occurrence of EM.

The resistivity of copper increases due to size-dependent scattering effects. For example, the 3-dimensional conducting path (i.e., the charge carrier can freely travel in any direction of the copper interconnect body) suffers the grain boundary and surface backscattering and thus possesses a shorter mean free path for the charge carriers. The barrier layer disposed between the copper interconnect body and the contact region are known in the art of microelectronic fabrication for inhibiting interdiffusion of copper-containing materials within microelectronic fabrications. Use of such barrier materials often compromises electrical performance of the interconnect structure.

Thus, the interconnect material is a bottle neck for further improving the interconnect structure with required performance and reliability. Some embodiments of the present disclosure provide a method for a self-selective, bottom-up growth of carbon-based materials in the interconnect structure of microelectronic devices. The self-selective, bottom-up growth of carbon-based materials is embodied by forming a catalyst layer on a surface parallel to another surface containing a 2-dimensional conduction feature. Some embodiments of the present disclosure provide a carbon-based interconnect structure with a substrate, a first conductive feature over the substrate and with materials of 1-dimensional conduction feature, a second conductive feature over the first conductive feature and with materials of 2-dimensional conduction feature, and a dielectric layer surrounding the first conductive feature and the second conductive feature.

The carbon-based interconnect structure and the manufacturing method thereof described in the present disclosure resolves the gap-filling problem for reduced dimension trenches and vias because in some embodiments, the self-selective, bottom-up growth does not require a seed layer and/or a barrier layer deposition. In other embodiments, a chemical vapor deposition (CVD), instead of an electrochemical plating operation, is used for the growth of the 1-dimensional conduction feature and the 2-dimensional conduction feature.

The carbon-based interconnect structure and the manufacturing method thereof described in the present disclosure also resolves the EM problem due to the 1-dimensional and 2-dimensional carrier transport mechanism in carbon-based materials. A higher limit of current density (for example, over $10^9$ A/cm$^2$) is allowed in the carbon-based interconnect structures described herein. In some embodiments, the serious carrier scattering problem in the 3-dimensional conducting path is replaced by a much lower carrier scattering in the 1-dimensional and 2-dimensional conducting path described herein, and hence creating a longer mean free path for carriers. The resistivity of the carbon-based interconnect structure can be suppressed by alleviating the EM and the carrier scattering problem.

In addition, the carbon-based interconnect provides a thermal conductivity more than one order of magnitude superior to that of the copper interconnect. For example, the thermal conductivity is in a range of from about 3000 W/(mK) to about 5000 W/(mK) for carbon nanotubes (CNT) or graphene sheet (GS) and about 400 W/(mK) for copper.

As shown in FIG. 1, an interconnect structure 10 includes a substrate 100, a first conductive feature 101 over the substrate 100, composed of materials with 1-dimensional conduction feature. A second conductive feature 102 is positioned over the first conductive feature 101, composed of materials with 2-dimensional conduction feature. A dielectric layer 105 surrounding the first conductive feature 101 and the second conductive feature 102 is disposed over the substrate 100. In some embodiments, the interconnect structure 10 further includes a third conductive feature 103 electrically connecting to the first conductive feature 101 and surrounded by the dielectric layer 105. The interconnect structure 10 includes a multi-layer interconnect (MU) structure and an inter-level dielectric (ILD) integrated with the MU structure, providing an electrical routing to couple various devices in the substrate 100 to the input/output power and signals. The interconnect structure 10 includes various metal lines, contacts and metal vias. The metal lines provide horizontal electrical routing. The contacts provide vertical connection between substrate 100 and metal lines or vias while vias provide vertical connection between metal lines in different metal layers or provide vertical connection between the contacts and the metal lines. As shown in FIG. 1, in some embodiments, the first conductive feature 101 can be a via, the second conductive feature 102 can be a metal line, and the third conductive feature 103 can be a contact connecting conductive region (not shown) in the substrate 100 and the via, or a metal line buried in the lower stack of the dielectric layer 105.

In some embodiments, the substrate 100 of the interconnect structure 10 includes silicon substrate. Alternatively, the substrate 100 may include other elementary semiconductor such as germanium. The substrate 100 may also include a compound semiconductor such as silicon carbide, gallium arsenic, indium arsenide, and indium phosphide. The substrate 100 may include an alloy semiconductor such as silicon germanium, silicon germanium carbide, gallium arsenic phosphide, and gallium indium phosphide. In one embodiment, the substrate 100 includes an epitaxial layer. For example, the substrate may have an epitaxial layer overlying a bulk semiconductor. Furthermore, the substrate 100 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 100 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 100 may further include other functional features such as a resistor or a capacitor formed in and on the substrate. The substrate 100 further includes lateral isolation features provided to separate various devices formed in the substrate 100. In one embodiment, shallow trench isolation (STI) features are used for lateral isolation. The various devices further include silicide disposed on S/D, gate and other device features for reduced contact resistance when coupled to the output and input signals.

Referring to FIG. 1, an etch stop layer 107 is positioned between the substrate 100 and the dielectric layer 105 surrounding the first conductive feature 101. In some embodiments with a third conductive layer 103, an etch stop layer 107 can be sandwiched between the dielectric layer 105 surrounding the third conductive feature 103 and the dielectric layer 105 surrounding the first conductive feature 101. In some embodiments, the first conductive feature 101 penetrates the etch stop layer 107 and is electrically connected to a conductive region below the etch stop layer 107. The etch stop layer 107 includes a dielectric material having an etch resistance significantly higher than the etch resistance of the dielectric material layer 105 during an etch process to pattern the dielectric material layer 105. In one example, the etch stop layer 107 includes silicon nitride, silicon carbide or other suitable material.

The first conductive feature 101 includes materials of 1-dimensional conductive feature. The 1-dimensional conductive feature referred herein includes materials with particular atomic arrangement that causes electrons travelled therein being laterally confined and thus occupy energy levels that are different from the traditional continuum of energy levels or bands found in bulk or 3-dimensional materials. For example, the materials of 1-dimensional conductive feature include, but are not limited to, nanowires, nanocapsules, and carbon nanotubes (CNTs). As shown in FIG. 1, in some embodiments, the CNTs start growing from the third conductive feature 103 and end at the top surface of the dielectric material layer 105 surrounding the first conductive feature 101. That is, the CNTs are formed along the Y direction. In one example, CNTs are randomly formed on the third conductive feature 103 without a catalyst layer deposited on the third conductive feature 103. Because in the above-mentioned example, the third conductive feature 103 can be metallic materials such as copper, and hence the third conductive feature 103 serves as a catalyst layer without additional treatment. In various examples, CNTs include single walled CNTs and/or multi-walled CNTs. In other examples, CNTs may be semiconductor type CNTs or metallic type CNTs. In some embodiments, a width W1 of the first conductive feature 101 is in a range of from about 10 nm to about 50 nm.

The second conductive feature 102 includes materials of 2-dimensional conductive feature. The 2-dimensional conductive feature referred herein includes materials with particular atomic arrangement that hinder electrons travelled therein being conducted along a particular direction. The materials of 2-dimensional conductive feature include, but are not limited to, graphene, boron nitride, dichalcogenides, silicene, and covalent organic or metalorganic networks. For example, graphene is composed of carbon atoms that are densely packed in a regular $sp^2$-bonded atomic-scale hexagonal pattern and demonstrates a 2-dimensional isotropic conduction on the 2-dimensional plane of a graphene sheet (GS). GS suffers high resistivity on the direction perpendicular to the plane of the GS due to the low density of pi-electron, and hence the electron conduction on said direction perpendicular to the plane of the GS is sufficiently low to an extent that the term "2-dimensional conduction" can be used to closely describe the electrical conduction behavior of the GS.

As shown in FIG. 1, in some embodiments, the GS starts growing from the sidewalls of the dielectric layer 105 toward the middle portion of the second conductive feature 102. That is, the 2-dimensional GS are formed on the YZ plane, and the GS on the YZ plane advances its front toward the middle portion of the second conductive feature 102. In some embodiments, a catalyst layer 109 is positioned at an interface between the second conductive feature 102 and the dielectric layer 105. Moreover, a thickness of the catalyst layer 109 is in a range of from about 0.5 nm to about 2 nm. The catalyst layer 109 is configured to catalyze the reaction of the growth of the GS, and includes a uniform layer of materials such as transitional metal (e.g. Co, Ni, Fe, etc) or conductive metal (e.g. Cu). In some embodiments, the catalyst layer 109 includes transitional metal or conductive metal doped in a diffusion barrier layer (not shown in FIG. 1). In some embodiments as shown in FIG. 1, the catalyst layer 109 is only formed at the sidewall of the dielectric layer 105 but on other planes in contact with the second conductive feature 102.

In some embodiments, a width W2 of the second conductive feature 102 is in a range of from about 10 nm to about 50 nm. For example, the width W2 can be equal to or larger than the width W1.

Referring to FIG. 1, the dielectric layer 105 includes silicon oxide, a low dielectric constant (low-k) material, other suitable dielectric material, or a combination thereof. The low-k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, porous materials, and/or other future developed low-k dielectric materials. In some embodiments, the dielectric layer 105 surrounding the first conductive feature 101, the second conductive feature 102, and the third conductive feature 103 are made of different low-k materials, respectively. However, in other embodiments, the dielectric layer 105 surrounding different conductive features can be made of the same low-k materials.

Figure 2:
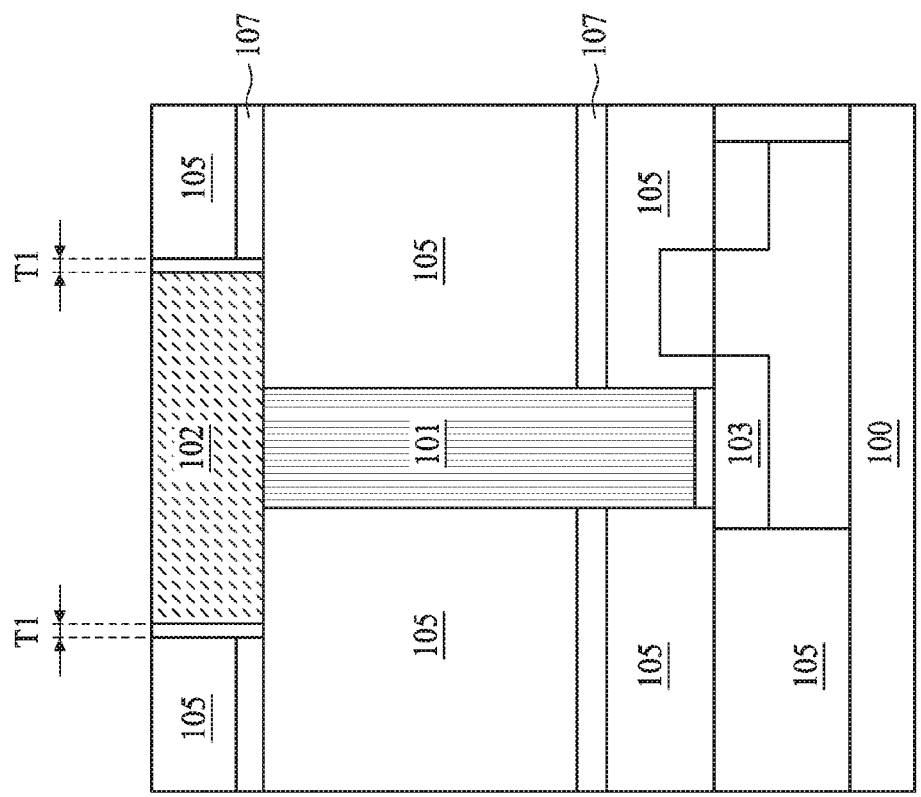
FIG. 2 is a cross sectional view of an interconnect structure, in accordance with some embodiments of the present disclosure.
Figure 3:
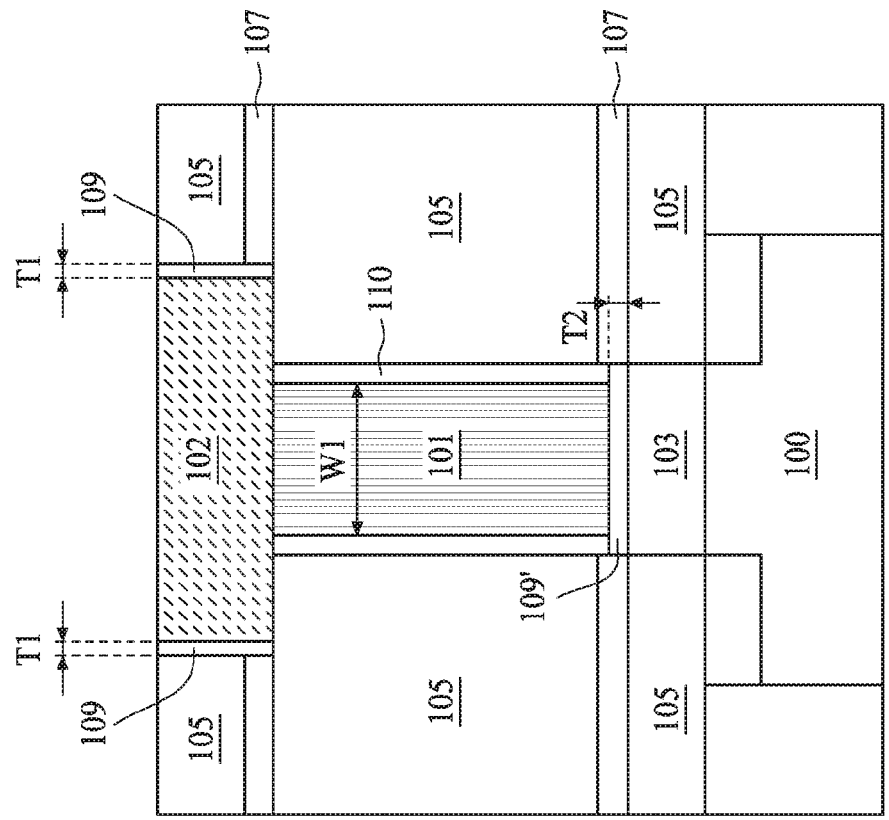
FIG. 3 is a cross sectional view of an interconnect structure, in accordance with some embodiments of the present disclosure.
Figure 4:
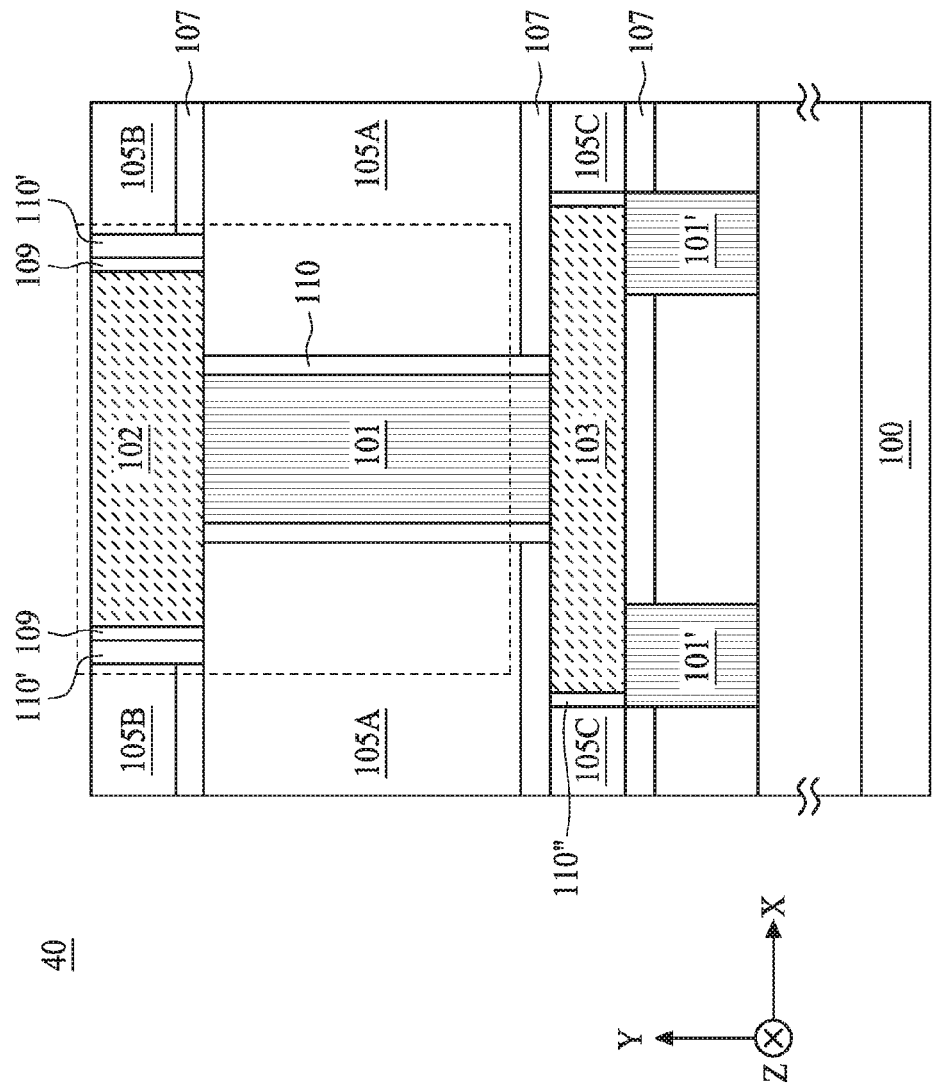
FIG. 4 is a cross sectional view of an interconnect structure, in accordance with some embodiments of the present disclosure.

Referring to FIG. 1, the third conductive feature 103 can further be a source, drain or gate electrode as shown in FIG. 2. Alternatively, the third conductive feature 103 is a silicide feature disposed on source, drain or gate electrode as shown in FIG. 3. The silicide feature may be formed by a self-aligned silicide (salicide) technique. In another embodiment, the third conductive feature 103 includes an electrode of a capacitor or one end of a resistor. In yet another embodiment where the substrate 100 is a portion of the interconnect structure, the third conductive feature 103 includes a contact, a via, or a metal line as shown in FIG. 4.

In FIG. 2, the third conductive feature 103 is source or a drain of a MOSFET structure. The first conductive feature 101 of the interconnect structure 20 is formed directly on the source or a drain of the MOSFET structure. In some embodiments, a silicide layer is not formed on top of the third conductive feature 103. In other embodiments, as shown in FIG. 2, a silicidation is performed and a silicide layer 109 is formed on top of the source or a drain before the formation of the first conductive feature 101. The transition metals used in the silicidation operation serve as another catalyst layer for the first conductive feature 101, apart from the catalyst layer 109 at the sidewall of the dielectric layer 105.

In FIG. 3, the third conductive feature 103 is gate of a MOSFET structure. The first conductive feature 101 of the interconnect structure 30 is formed on the gate of the MOSFET structure. In some embodiments, a silicide layer is formed on top of the third conductive feature 103 shown in FIG. 3. The materials used for silicidation operation is compatible with those in the MOSFET fabrication and is not listed here for simplicity. The interconnect structure 30 includes a first catalyst layer 109 situated at the sidewall of the dielectric layer surrounding the second conductive feature 102. Compared to the interconnect structure 20, the interconnect structure 30 further includes a second catalyst layer 109' between the third conductive feature 103 and the first conductive feature 101. A thickness of the first catalyst layer T1 can be in a range of from about 0.5 nm to about 2 nm, and a thickness T2 of the second catalyst layer can be in a range of from about few nanometers to tens of nanometers.

As shown in FIG. 3, a barrier layer 110 is formed between the first conductive feature 101 and the dielectric layer 105. The barrier layer 110 provides an effective prevention from carbon diffusion into the dielectric layer 105. In one example, the barrier layer 110 includes tantalum nitride (TaN) and or tantalum (Ta). In other examples, the barrier layer 110 may include other suitable material, such as titanium nitride (TiN). The barrier layer 110 may be formed by physical vapor deposition (PVD) or other suitable techniques.

In FIG. 4, the third conductive feature 103 is a metal line configured to laterally connect the two vias 101' in the lower layer of the interconnect structure 40. In some embodiments, the two vias 101' in the lower layer includes 1-dimensional conductive features such as CNTs, and the third conducive feature 103 includes 2-dimensional conductive features such as GS. As described previously in the present disclosure, the 1-dimensional conductive feature conducts electrons in the Y direction, whereas the 2-dimensional conductive feature conducts electrons freely in the planes having a normal direction perpendicular to the Y direction. Said planes include a YZ plane or an XY plane depending on which surface the catalyst layer is deposited. For example, the GS of the second conductive feature 102 is formed on the YZ plane because the catalyst layer 109 is deposited on the sidewall of the second dielectric layer 105B, that is, on a YZ plane. Under this condition, a low resistance can be reached when charge carriers are travelling effectively in the Z direction (i.e. the electrons can freely move on the YZ plane). However, because the first conductive feature 103 is a metal line extending along the X direction, the GS of the first conductive feature 103 is formed on the XY plane if the catalyst layer (not shown in FIG. 4) is deposited on a XY plane. Therefore, the orientation of the GS can be determined in a self-selective manner according to the planes where the catalyst deposited.

In FIG. 4, the dielectric layer surrounding the first conductive feature 101 is a first dielectric layer 105A, the dielectric layer surrounding the second conductive feature 102 is a second dielectric layer 105B, the dielectric layer surrounding the third conductive feature 103 is a third dielectric layer 105C.

The numeral labels shown in FIG. 4 that are the same as those in FIGS. 1 to 3 refer to the same structures or their equivalents and are not repeated here for simplicity. In some embodiments, a barrier layer 110" is positioned between the third conductive feature 103 and the third dielectric layer 105C, and a barrier layer 110 is positioned between the first conductive feature 101 and the first dielectric layer 105A. A first catalyst layer 109 is formed between the second conductive feature 102 and the second dielectric layer 105B, particularly, when a barrier layer 110' exist in the interconnect structure 40, the first catalyst layer 109 is positioned between the second conductive feature 102 and the barrier layer 110'. In some embodiments, an interfacial material layer (not shown) is disposed between the second conductive feature 102 and the barrier layer 110' for better material integration. In one example, the interfacial material layer includes ruthenium (Ru).

Figure 5:
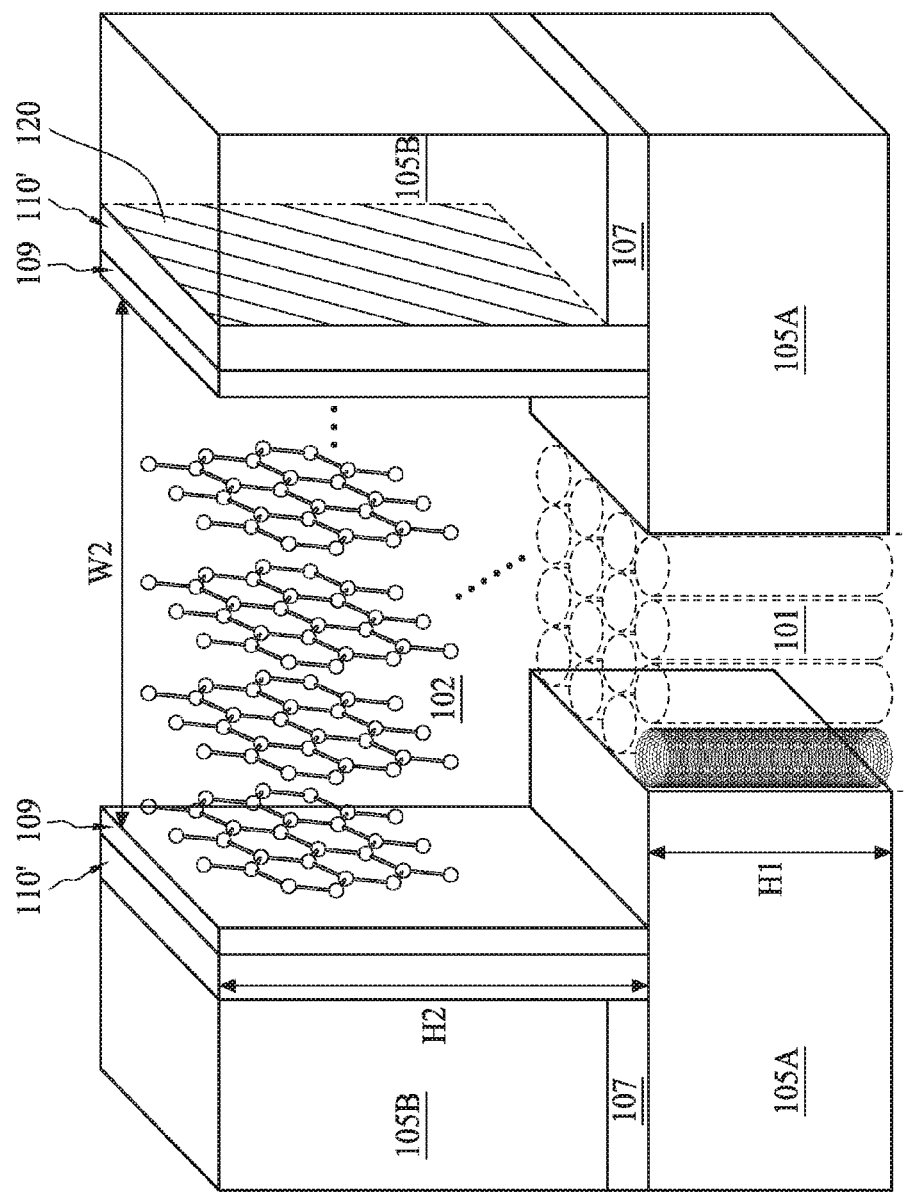
FIG. 5 is a perspective view of an enlarged portion surrounded by dotted lines as shown in the interconnect structure in FIG. 4, in accordance with some embodiments of the present disclosure.

FIG. 5 is a perspective view of an enlarged portion surrounded by dotted lines as shown in the interconnect structure 40 in FIG. 4. The dotted lines encompass the first conductive feature 101 and the second conductive feature 102. In FIG. 5, an illustration of the 2-dimensional atomic arrangement of GS is shown is the region of second conductive feature 102, whereas the atomic arrangement of CNTs is shown in the region of the first conductive feature 101. As shown in FIG. 5, the electron is freely conducted on a plane of the GS, or the surface parallel to an interface 120 between the second conductive feature 102 and the second dielectric layer 105B. In some embodiments, the catalyst layer 109 is positioned only on the sidewall of the second dielectric layer 105B, and is free from the top surface of the first dielectric layer 105A or the top surface of the first conductive feature 101. As a result, the GS are grown self-selectively on the plane where the catalyst layer 109 disposed.

Referring to FIG. 5, an aspect ratio (H1/W1) of the first conductive feature 101 is in a range of from about 4 to about 10. An aspect ratio (H2/W2) of the second conductive feature 102 is in a range of from about 4 to about 10. In some embodiments, the aspect ratio (H1/W1) is equivalent to or larger than the aspect ratio (142/W2).

Figure 6:
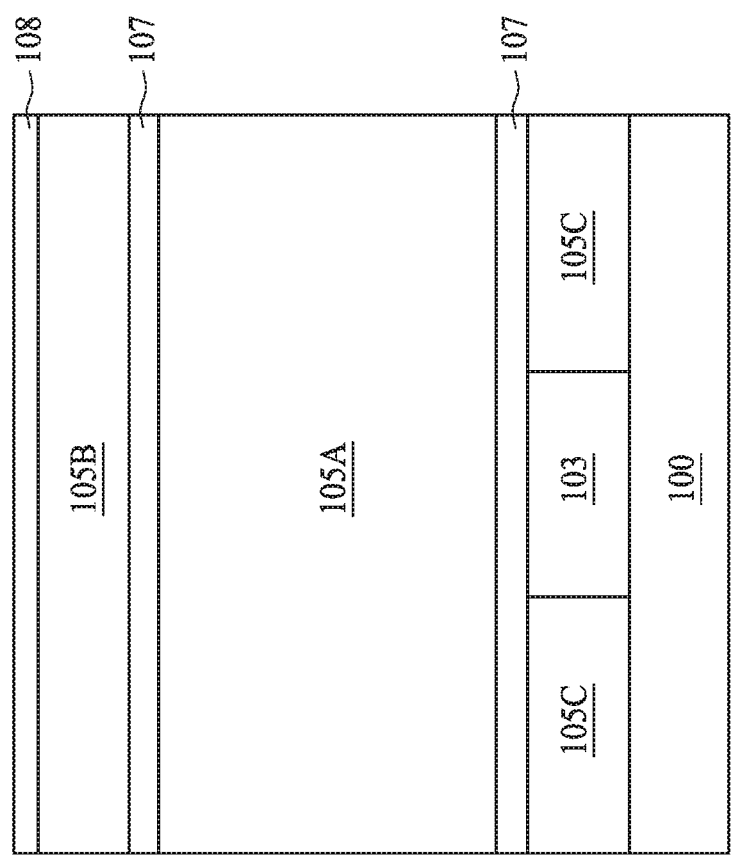
FIG. 6 to FIG. 12 are fragmental views in several operations for manufacturing an interconnect structure, in accordance with some embodiments of the present disclosure.

FIG. 6 to FIG. 12 are fragmental views in several operations for manufacturing interconnect structures 10 and 20 shown in FIG. 1 and FIG. 2 of the present disclosure. The numeral labels shown in FIGS. 6 to 12 that are the same as those in FIGS. 1 to 5 refer to the same structures or their equivalents and are not repeated here for simplicity. In FIG. 6, a low-k dielectric stack includes a substrate 100, a first dielectric layer 105A, a second dielectric layer 105B, and a third dielectric layer 105C surrounding the third conductive feature 103. In some embodiments, etch stop layers 107 are formed between different dielectric layers. In other embodiments, only the etch stop layer 107 between the third dielectric layer 105C and the first dielectric layer 105A is formed.

As shown in FIG. 6, a cap layer 108 is formed on top of the second dielectric layer 105B. The cap layer 108 is nitrogen free, and comprises materials such as carbon and oxygen. The cap layer 108 is also used as a bottom anti-reflective coating (BARC), which is used for patterning the subsequently formed metal hard mask. Therefore, the cap layer 108 is alternatively referred to as nitrogen-free anti-reflective coating (NFARC). In some embodiments, a hard mask layer (not shown) may be formed on top of the cap layer 108. The hard mask maybe formed of metallic materials, such as Ti, TiN, Ta, TaN, Al, and the like, although in a non-metal hard mask scheme, non-metallic materials such as $SiO_2$, SiC, SiN and SiON may be used. The formation methods of the cap layer 108 include chemical vapor deposition (CVD) and physical vapor deposition (PVD). However, other methods such as atomic layer deposition (ALD) may also be used.

Figure 7B:
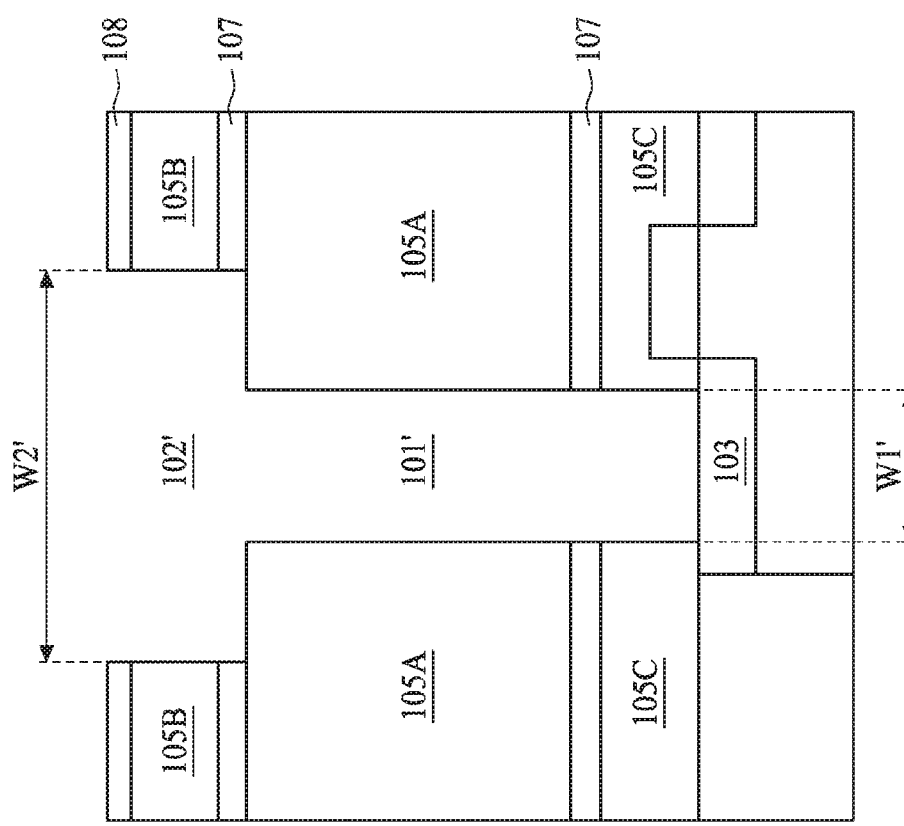

FIG. 7A and FIG. 7B each illustrates the fragmental cross sectional view of the interconnect structures show in FIG. 1 and FIG. 2, respectively. In FIG. 7A, the third conductive feature 103 is a metal line surrounded by the third dielectric layer 105C, whereas in FIG. 7B, the third conductive feature 103 is a source or a drain region of a MOSFET. Dielectric patterning operations are performed in FIG. 7A and FIG. 7B to form a via opening 101' and a line trench 102' in the low-k dielectric stack including 105A and 105B. The via opening 101' is formed by patterning the first dielectric material layer 105A. In some embodiments, the patterning operation includes a lithography process and an etching process. The lithography process forms a patterned photoresist layer having an opening that defines a region for the via opening 101'.

The etching process performed in FIGS. 7A and 7B may include two etch steps to respectively remove the first dielectric material layer 105A and the etch stop layer 107 within the opening of the patterned photoresist layer. The patterned photoresist layer is removed by wet stripping or plasma ashing after the etching. In some embodiments, the same operation applies to the formation of the line trench 102'. In FIG. 7B, however, the via opening 101' penetrates not only through the first dielectric layer 105A, the etch stop layer 107, but also the third dielectric layer 105C, in order to expose the source or drain region of the MOSFET in the substrate 100. Note the via opening 101' possesses a width W1' that is equal to or smaller than a width W2' of the line trench 102'. The widths W1' and W2' are formed to have dimensions within a range of from a bout 10 nm to about 50 nm.

Figure 8A:
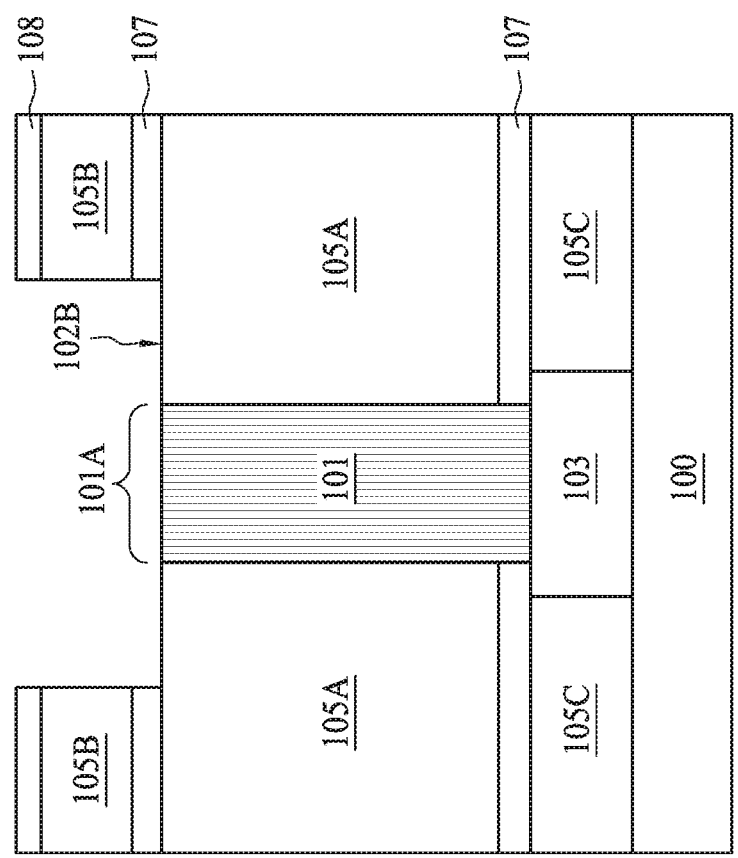
Figure 8B:
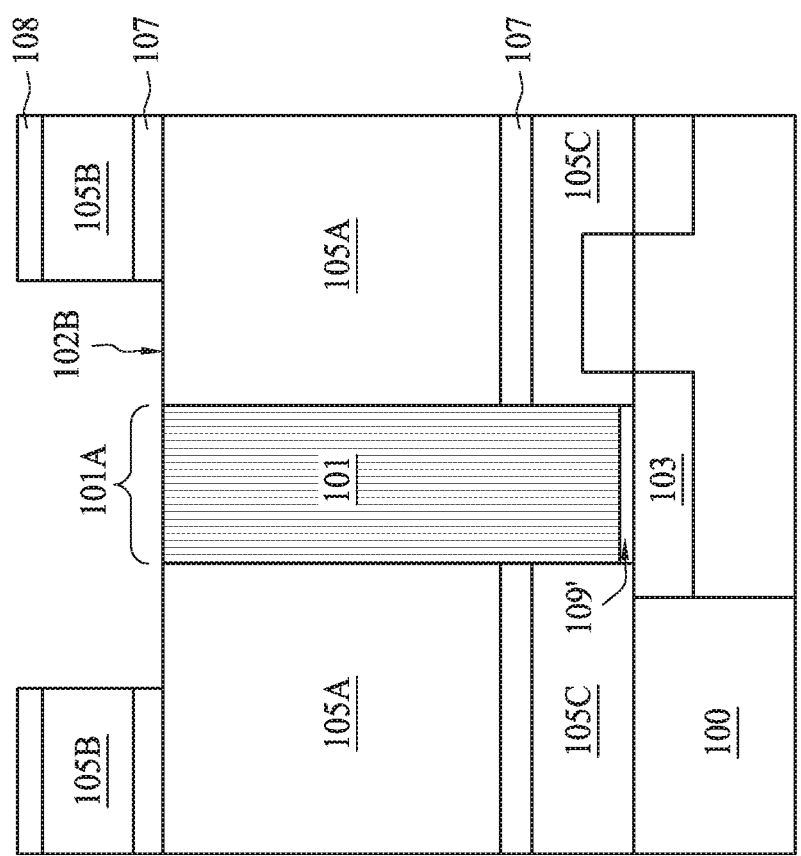

FIG. 8A and FIG. 8B each illustrates the fragmental cross sectional view of the interconnect structures show in FIG. 1 and FIG. 2, respectively. A 1-dimensional conductive feature 101 is formed in the via opening 101' as shown previously in FIGS. 7A and 7B. In some embodiments, the 1-dimensional conductive feature 101 includes CNTs. The CNTs can be formed by a chemical vapor deposition (CVD) operation or a plasma enhanced CVD (PE-CVD) operation. In one example, the precursor includes hydrocarbon $C_xH_y$ such as methane (CH$_4$) and hydrogen (H$_2$). As shown in FIG. 8A, during the CVD process, the gas flow and the substrate temperature are designed such that CNTs can be efficiently grown on the third conducive feature 103, such as a copper conductive line, with better material integration. As shown in FIG. 8B, a silicide layer 109' is formed on the top of the third conductive feature 103 before starting the CNTs growth. In some embodiments, the silicide layer 109' may be formed by a self-aligned silicide (salicide) technique.

Referring to the CNTs growth described previously in FIGS. 8A and 8B, the CVD process may include multiple steps: (1) applying H$_2$ gas and heats the substrate to a target deposition temperature in a range of from about 25 to about 1000 degrees Celsius; (2) applying H$_2$ and CH$_4$ for CNTs growth at the target deposition temperature. The gas CH$_4$ and H$_2$ are maintained with a gas flow ratio CH$_4$/H$_2$ grater than one; (3) cooling down the substrate. While maintaining the substrate 100 at the target deposition temperature and CNTs growth, the CVD deposition chamber is maintained at a pressure ranging between about 0.1 Torr and about 760 Torr. The gas flow in the CVD deposition chamber is maintained within a range of from about 100 to about 10000 SCCM. During the application of the precursor gas and the reactant, purge gas is always on from the beginning to the end. In some embodiments, the purge gas extends for predetermined amount of time after the precursor gas and the reactant is closed.

Referring to the CNTs growth described previously, in some embodiments, growth parameters such as deposition temperature, precursor and reactant, chamber pressure, gas flow of the PE-CVD operation are similar to those used in the CVD operation. In some embodiments, the plasma power of the PE-CVD operation for CNTs growth is in a range of from about 50 W to about 1000 W. In some embodiments, the CNTs grown in the first conductive feature 101 demonstrate a bottom growth mechanism where the catalyst materials (e.g. copper in FIG. 8A and transition metal silicide in FIG. 8B) is remained at the bottom of the CNTs. The height of the CNTs can be controlled by tuning the CVD or PE-CVD growth duration. In some embodiments, a top surface 101A of the CNTs is substantially coplanar with the bottom surface 102B of the line trench as shown in FIGS. 8A and 8B.

Figure 9:
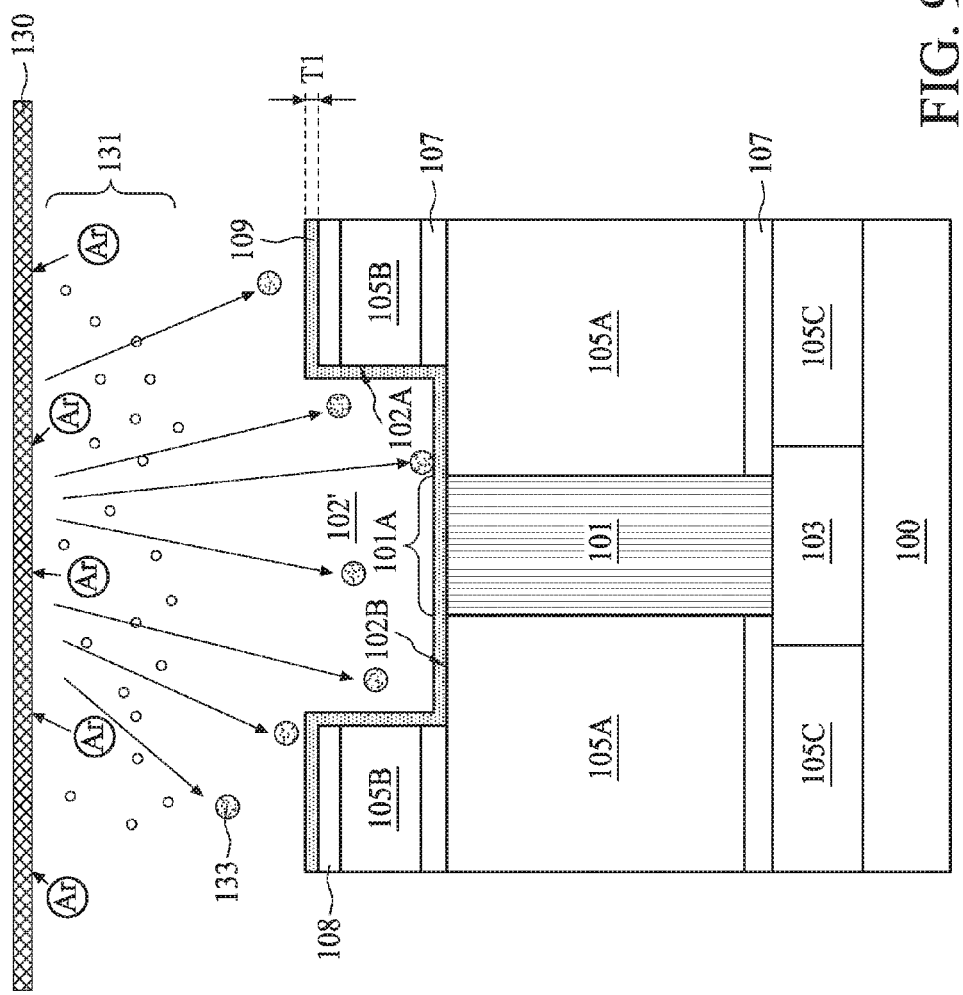

Referring to FIG. 9, a catalyst layer 109 is formed over the line trench 102'. In some embodiments, a physical vapor deposition (PVD) operation or a CVD operation can be used to form a conformal catalyst layer 109 delineating the top surface 101A of the 1-dimensional conductive feature 101, the bottom surface 102B of the line trench 102', and the sidewall 102A of the line trench 102'. As shown in FIG. 9, in some embodiments, a PVD operation such as a vacuum evaporation followed by a condensation can be used. In other embodiments, a plasma sputtering operation having a DC power of from about 1000 kW to about 50000 kW may be used. The pressure in the sputtering chamber is maintained in a range of from about 0.1 mTorr to about 200 mTorr, and the temperature of the substrate can be controlled in a range of from about −50 degrees Celsius to about 200 degrees Celsius. In FIG. 9, a sputtering target 130 is placed at a top portion of the sputtering chamber with a magnetic field (not shown in FIG. 9) enhancing the bombardment of the argon ions toward the target 130. Plasma 131 is generated near the sputtering target 130. In some embodiments, the sputtering target includes, but is not limited to, Fe, Co, Ni, Cu and the alloys thereof. The catalytic atoms 133 being sputtered from the target 130 travels in a line of sight direction and deposited over the line trench 102'. In some embodiments, a uniform thickness T1 of the catalyst layer 109 formed by a PVD operation can be in a range of from about 0.5 nm to about 2 nm.

As discussed previously in FIG. 9, a CVD operation can be used to deposit the catalyst layer 109. In some embodiments, the CVD deposition chamber is maintained at a pressure ranging between about 0.1 Torr and about 760 Torr. The gas flow in the CVD deposition chamber is maintained within a range of from about 100 to about 5000 SCCM. Depending on the reactivity of the precursor or reactant used, the substrate temperature can be controlled within a range of from about 25 degrees Celsius to about 500 degrees Celsius. During the application of the precursor gas and the reactant, purge gas is always on from the beginning to the end. In some embodiments, the purge gas extends for predetermined amount of time after the precursor gas and the reactant is closed. In some embodiments, a uniform thickness T2 of the catalyst layer 109 formed by a CVD operation can be in a range of from about 0.5 nm to about 2 nm.

Figure 10:
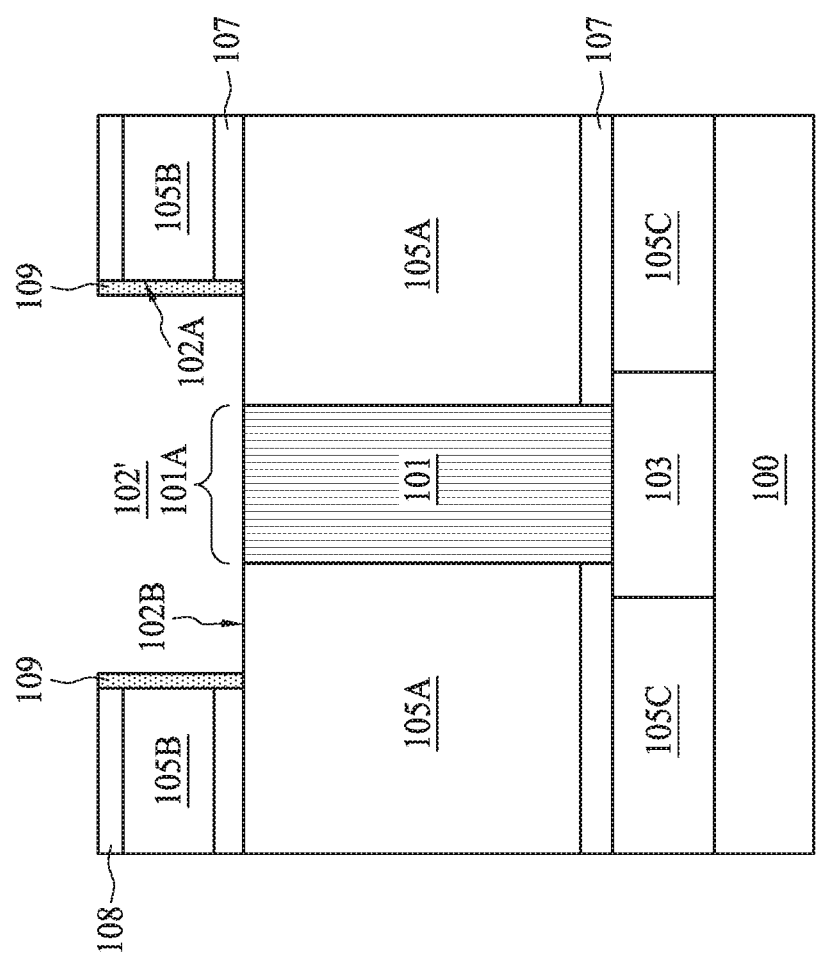

Referring to FIG. 10, a selective portion of the catalyst layer 109 shown in FIG. 9 is removed. An anisotropic etch such as a plasma dry etch can be used to remove the portion of the catalyst layer 109 resides on top of the cap layer 108, on the bottom surface 102B of the line trench 102', and on the top surface 101A of the 1-dimensional conductive feature 101. In other words, the catalyst layer 109 originally deposited on the horizontal portion of the interconnect structure is removed in the present operation. As shown in FIG. 10, in some embodiments, the bottom surface 102B of the line trench 102' is free of catalyst layer 109 and thus the subsequent formation of the second conductive feature 102 as shown in FIGS. 1 to 5 is not preferred to initiate from said bottom surface 102B.

Figure 11:
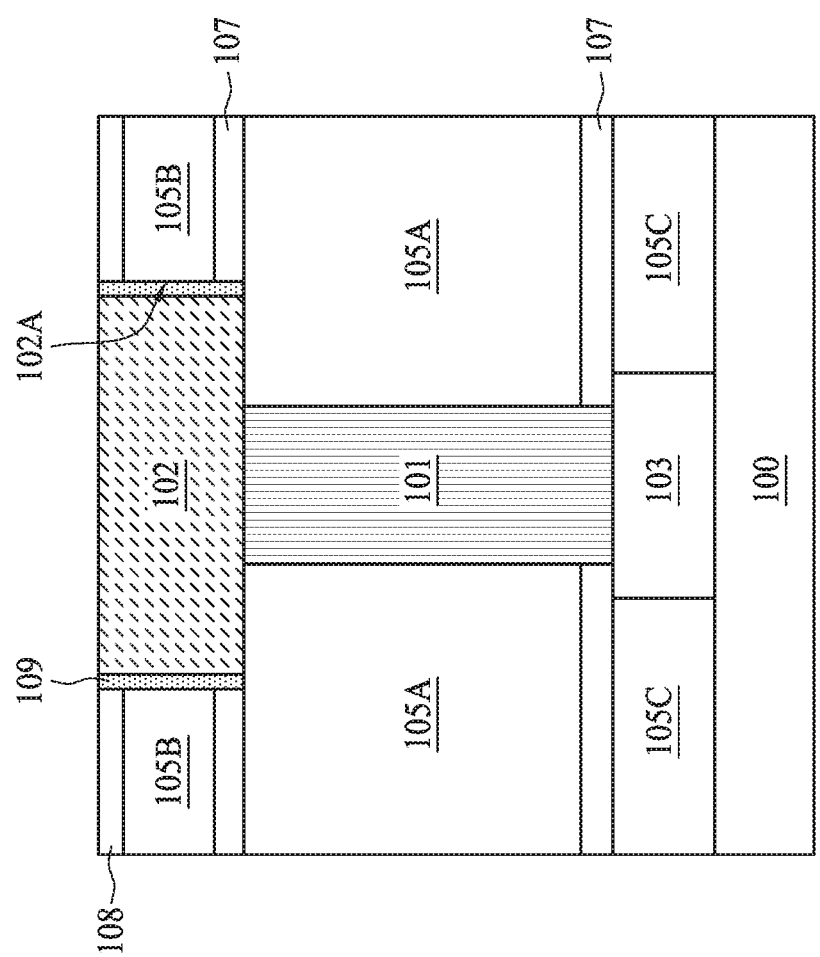
Figure 12:
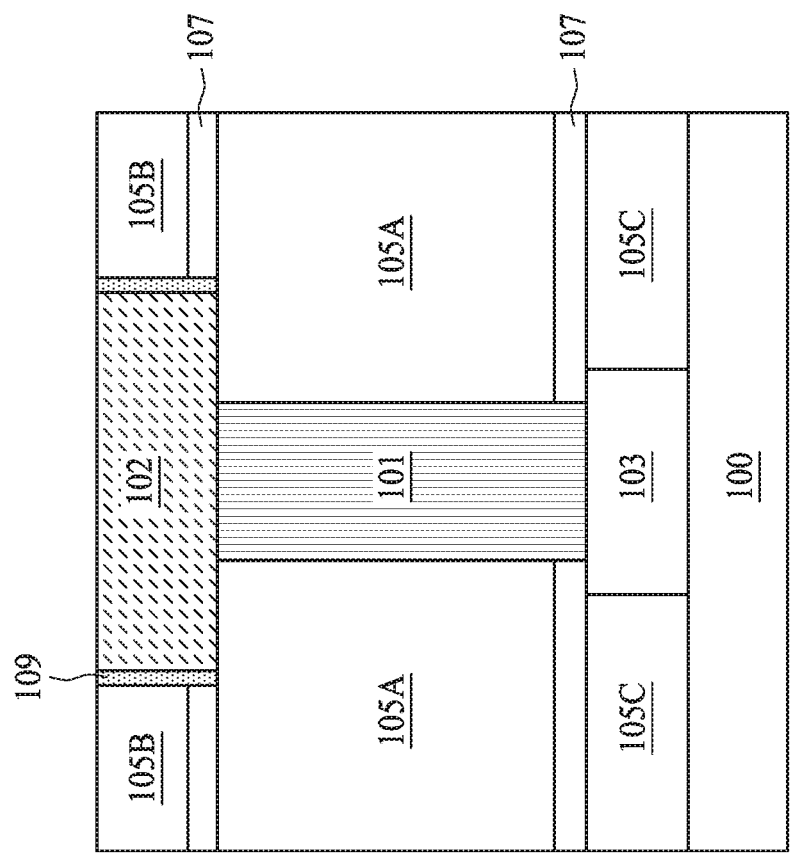

Referring to FIG. 11, a 2-dimensional conductive feature 102 is formed in the line trench 102' shown in FIGS. 7A to 10. In some embodiments, the 2-dimensional conductive feature 102 includes graphene sheet (GS). The GS can be formed by a chemical vapor deposition (CVD) operation or a plasma enhanced CVD (PE-CVD) operation. In one example, the precursor includes hydrocarbon $C_xH_y$ such as methane (CH$_4$) and hydrogen (H$_2$). As shown in FIG. 11, during the CVD process, the gas flow and the substrate temperature are designed such that GS can be efficiently grown from the catalyst layer 109 at the sidewall 102A toward the middle portion of the 2-dimensional conductive feature 102.

Referring to the GS growth described previously in FIG. 11, the CVD process may include multiple steps: (1) applying H$_2$ gas and heats the substrate to a target deposition temperature in a range of from about 25 to about 1000 degrees Celsius; (2) applying H$_2$ and CH$_4$ for GS growth at the target deposition temperature. The gas CH$_4$ and H$_2$ are maintained with a gas flow ratio CH$_4$/H$_2$ grater than one; (3) cooling down the substrate. While maintaining the substrate 100 at the target deposition temperature and GS growth, the CVD deposition chamber is maintained at a pressure ranging between about 0.1 Torr and about 760 Torr. The gas flow in the CVD deposition chamber is maintained within a range of from about 100 to about 10000 SCCM. During the application of the precursor gas and the reactant, purge gas is always on from the beginning to the end. In some embodiments, the purge gas extends for predetermined amount of time after the precursor gas and the reactant is closed.

Referring to the GS growth described previously, in some embodiments, growth parameters such as deposition temperature, precursor or reactant, chamber pressure, gas flow of the PE-CVD operation are similar to those used in the CVD operation. In some embodiments, the plasma power of the PE-CVD operation for GS growth is in a range of from about 50 W to about 1000 W. In some embodiments, the GS grown in the 2-dimensional conductive feature 102 demonstrates a layer-by-layer, bottom up growth from the catalyst surface Referring to FIG. 12, a top portion of the interconnect structure shown in FIG. 11 optionally removed by performing a planarization operation. In some embodiments, the cap layer 108, a portion of the 2-dimensional conductive feature 102, and a portion of the catalyst layer 109 at the sidewall of the cap layer 108 is removed by a chemical mechanical polishing operation.

Some embodiments of the present disclosure provide an interconnect structure. The interconnect structure includes a substrate, a first conductive feature over the substrate and with materials of 1-dimensional conduction feature, a second conductive feature over the first conductive feature and with materials of 2-dimensional conduction feature, and a dielectric layer surrounding the first conductive feature and the second conductive feature. A width of the first conductive feature and a width of the second conductive feature are in a range of from about 10 nm to about 50 nm.

In some embodiments of the present disclosure, the interconnect structure further includes a third conductive feature under the first conductive feature, electrically connected with the first conductive feature.

In some embodiments of the present disclosure, the third conductive feature of the interconnect structure includes a source region, a drain region, a gate region, a conductive via, a conductive line, or a contact region.

In some embodiments of the present disclosure, the first conductive feature of the interconnect structure includes a carbon nanotube (CNT).

In some embodiments of the present disclosure, the second conductive feature of the interconnect structure includes a graphene sheet (GS).

In some embodiments of the present disclosure, the interconnect structure further includes a first catalyst layer at an interface between the second conductive feature and the dielectric layer.

In some embodiments of the present disclosure, a thickness of the catalyst layer of the interconnect structure is in a range of from about 0.5 nm to about 2 nm.

In some embodiments of the present disclosure, the interconnect structure further includes a second catalyst layer at an interface between the first conductive feature and the third conductive feature.

In some embodiments of the present disclosure, the 2-dimensional conduction feature of the second conductive feature includes a structure conducting electrons on a surface parallel to the interface between the second conductive feature and the dielectric layer.

In some embodiments of the present disclosure, the interconnect structure further includes a barrier layer between the first catalyst layer and the dielectric layer.

Some embodiments of the present disclosure provide an integrated circuit (IC) structure. The IC structure includes a substrate, a 1-dimensional conductive feature comprising a carbon nanotube over the substrate, a first dielectric layer surrounding the 1-dimensional conductive feature, a 2-dimensional conductive feature comprising a graphene sheet over the substrate, and a second dielectric layer surrounding the 2-dimensional conductive feature. The aspect ratio of the 1-dimensional conductive feature and an aspect ratio of the 2-dimensional conductive feature are in a range of from about 4 to about 10.

In some embodiments of the present disclosure, the IC structure further includes an etch stop layer between the substrate and the first dielectric layer.

In some embodiments of the present disclosure, the IC structure further includes a catalyst layer of the graphene sheet between the 2-dimensional conductive feature and the second dielectric layer.

In some embodiments of the present disclosure, the IC structure further includes a barrier layer between the 1-dimensional conductive feature and the first dielectric layer.

Some embodiments of the present disclosure provide a method for manufacturing an interconnect structure. The method includes (1) forming a via opening and a line trench in a dielectric layer, (2) forming a 1-dimensional conductive feature in the via opening, (3) forming a conformal catalyst layer over a sidewall of the line trench, a bottom of the line trench, and a top of the 1-dimensional conductive feature, (4) removing the conformal catalyst layer from the bottom of the line trench and the top of the 1-dimensional conductive feature, and (5) forming a 2-dimensional conductive feature in the line trench. Whereas in operation (1), a width of the line trench is formed to be in a range of from about 10 nm to about 50 nm.

In some embodiments of the present disclosure, the method of forming the 1-dimensional conductive feature in the via opening includes performing a chemical vapor deposition (CVD), and the forming the 2-dimensional conductive feature in the line trench includes performing a CVD.

In some embodiments of the present disclosure, the method of the forming the conformal catalyst layer includes forming a metal layer with a thickness ranging from about 0.5 nm to about 2 nm by performing a physical vapor deposition, a chemical vapor deposition, or a combination thereof.

In some embodiments of the present disclosure,

In some embodiments of the present disclosure, the method further includes performing a chemical mechanical polishing to remove a portion of the 2-dimensional conductive feature and a portion of the conformal catalyst layer.

In some embodiments of the present disclosure, the method further includes forming a catalyst layer at a bottom of the via opening prior to the forming of the 1-dimensional conductive feature.

In some embodiments of the present disclosure, the method of removing the conformal catalyst layer from the bottom of the line trench and the top of the 1-dimensional conductive feature includes performing a dry etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an interconnect structure, comprising:
   forming a via opening and a line trench in a dielectric layer, wherein a width of the via opening and a width of the line trench are in a range of from about 10 nm to about 50 nm;
   forming carbon nanotubes (CNTs) in the via opening;
   forming a conformal catalyst layer over a sidewall of the line trench, a bottom of the line trench, and a top of the CNTs;
   removing the conformal catalyst layer from the bottom of the line trench and the top of the CNTs; and
   forming a 2-dimensional conductive feature in the line trench.

2. The method of claim 1, wherein the forming the CNTs in the via opening comprises performing a chemical vapor deposition (CVD), and the forming the 2-dimensional conductive feature in the line trench comprises performing a CVD.

3. The method of claim 1, wherein the forming the conformal catalyst layer comprises forming a metal layer with a thickness ranging from about 0.5 nm to about 2 nm by performing a physical vapor deposition, a chemical vapor deposition, or a combination thereof.

4. The method of claim 1, further comprising performing a chemical mechanical polishing to remove a portion of the 2-dimensional conductive feature and a portion of the conformal catalyst layer.

5. The method of claim 1, further comprising forming a catalyst layer at a bottom of the via opening prior to the forming of the CNTs.

6. The method of claim 5, wherein the catalyst layer comprises transition metal silicide or metal.

7. The method of claim 1, wherein the removing the conformal catalyst layer from the bottom of the line trench and the top of the CNTs comprises performing a dry etch.

8. A method for manufacturing a semiconductor structure, comprising:
   forming a via opening and a line trench in a dielectric layer, the line trench being wider than the via opening;
   forming a first conductive feature in the via opening;
   forming a conformal catalyst layer over a sidewall of the line trench, a bottom of the line trench, and a top of the first conductive feature;
   removing the conformal catalyst layer from the bottom of the line trench and the top of the first conductive feature; and
   forming a second conductive feature in the line trench.

9. The method of claim 8, further comprising forming a third conductive feature underlying and in contact with the first conductive feature.

10. The method of claim 9, wherein the third conductive feature comprises silicide.

11. The method of claim 9, wherein the third conductive feature comprises copper.

12. The method of claim 8, wherein the forming the first conductive feature comprises forming carbon nanotubes (CNTs) by a chemical vapor deposition (CVD) operation.

13. The method of claim 8, wherein the forming the second conductive feature comprises forming graphene by a CVD operation.

14. The method of claim 8, wherein the removing the conformal catalyst layer comprises performing an anisotropic etch.

15. The method of claim 8, wherein the forming the conformal catalyst layer comprises depositing Fe, Co, Ni, Cu or alloys thereof.

16. A method for manufacturing an interconnect structure, comprising:
   forming a via opening having a first aspect ratio in a first dielectric layer;
   forming a line trench having a second aspect ratio over the via opening in a second dielectric layer, the first aspect ratio being equivalent to or greater than the second aspect ratio;
   forming a first conductive feature in the via opening after forming the via opening in the first dielectric layer and the line trench in the second dielectric layer;
   forming a conformal catalyst layer over the line trench, a bottom of the line trench, and a top of the first conductive feature;
   removing the conformal catalyst layer from the bottom of the line trench and the top of the first conductive feature; and
   forming a second conductive feature in the line trench.

17. The method of claim 16, further comprising:
   forming a first barrier layer between the first dielectric layer and the first conductive feature; and
   forming a second barrier layer between the second dielectric layer and the second conductive feature.

18. The method of claim 17, wherein the first barrier layer and the second barrier layer comprise Ta, TaN, TiN, or combinations thereof.

19. The method of claim 18, further comprising forming a ruthenium (Ru)-containing layer between the second conductive feature and the second barrier layer.

20. The method of claim 16, further comprising forming a third conductive feature underlying and in contact with the first conductive feature in a third dielectric layer.

* * * * *